United States Patent [19]

Ishiyama

[11] Patent Number: 5,705,954
[45] Date of Patent: Jan. 6, 1998

[54] DIFFERENTIAL OUTPUT TYPE FILTER CIRCUIT

[75] Inventor: Masami Ishiyama, Yamagata, Japan

[73] Assignee: NEC Corporation, Tokyo, Japan

[21] Appl. No.: 637,494

[22] Filed: Apr. 25, 1996

[30] Foreign Application Priority Data

Apr. 25, 1995 [JP] Japan ............................. 7-100959

[51] Int. Cl.$^6$ ................................. H03F 3/191
[52] U.S. Cl. ............................ 330/303; 330/306
[58] Field of Search ........................ 327/552; 330/149, 330/301, 303, 306

[56] References Cited

U.S. PATENT DOCUMENTS 5,345,190  9/1994  Kaylor ..................... 330/303 X

Primary Examiner—Seven Mottola
Attorney, Agent, or Firm—Sughrue, Mion, Zinn, Macpeak & Seas, PLLC

[57] ABSTRACT

A differential output type filter circuit comprises, between its input terminal and differential output terminal, a reference voltage generator circuit which receives supply voltage Vcc and outputs a reference voltage, an SVR correction circuit which filters out the noise component superposed on said reference voltage, an n-order filter circuit which functions to filter out the noise of an input signal corresponding to the input of this applied signal, this n-order filter circuit being composed of a first-stage primary filter circuit 3 and an (n−1)-order filter circuit 4, and a post-amplifier circuit 5 which receives and differentially amplifies the output signal from the SVR correction circuit and output signal 105 from said n-order filter circuit. This configuration represents a so-called single-signal input type filter circuit, and features compactness and excellent SVR characteristics.

4 Claims, 5 Drawing Sheets

DIFFERENTIAL OUTPUT TYPE FILTER CIRCUIT

BACKGROUND OF THE INVENTION

1. Field of Invention

The present invention relates to a differential output type filter circuit, especially, to a differential output type filter circuit that combines the advantages of both a differential signal input type filter and single-signal input type filter.

2. Description of the Related Art

Generally, there are two types of filter circuits, namely, differential output filter circuits and single output filter circuits. To avoid the adverse effects of noise superimposed on a signal, it is a general practice to employ a differential output filter circuit that provides excellent noise characteristics. Especially in the area of floppy disk drives (FDD), where a filter output is applied a zero-cross comparator, differential output filter circuits with good noise characteristics are needed.

Conventional differential output filter circuits are classified into two large groups. As shown in FIG. 1, a differential output filter circuit of one group comprises (A) an n-order filter circuit composed of a first-stage primary filter circuit 27 and an (n-1)-order filter circuit 29 in correspondence with the positive-phase side signal input, (B) an n-order filter circuit composed of a first-stage primary filter circuit 28 and an (n-1)-order filter circuit 30 in correspondence with the negative-phase side signal input, and (C) a post-amplifier circuit 31 which applies differential amplification to the outputs of those two n-order filter circuits, between (1) a differential input terminal 26 through which a differential signal from the other part is applied, and (2) a differential output terminal 32 through which the differential signal from the filter circuit is delivered. This filter circuit is known as a differential signal input type filter circuit.

As shown in FIG. 2, a differential output filter circuit of the other group comprises (A) a reference voltage generator circuit 34 which receives supply voltage Vcc and outputs reference voltage 110, (B) an n-order filter composed of a first-stage primary filter circuit 35 and an (n-1)-order filter circuit 36 in correspondence with the signal input from input terminal 33, and (C) a post-amplifier circuit 37 which receives reference voltage 110 and signal 112 from the n-order filter circuit. The latter circuit performs differential amplification between (1) an input terminal 83 through which a single signal is input, and a differential output terminal 38 through which the differential signal from the filter circuit is delivered. This filter circuit is known as a single-signal input type filter circuit.

In the differential signal input type filter circuit illustrated in FIG. 1, if supply voltage Vcc has noise superposed, the differential signal which enters through the differential input terminal 26 also carries this superposed noise. The positive-phase input signal and the negative-phase input signal are delivered as signal 106 and signal 107, respectively, after having their noise components reduced by the first-stage primary filter circuits 27 and 28 with identical characteristics. As they pass through the corresponding (n-1)-order filter circuits 29 and 30, their noise components are filtered further. Then, they are delivered as differential output signals 108 (positive phase) and 109 (negative phase), to be applied to the post-amplifier circuit 31 as differential signals with good supply voltage rejection characteristics (hereinafter referred to as SVR characteristics) and a reduced noise level. The post-amplifier circuit 31 differentially amplifies those differential output signals 108 and 109, and outputs them through the differential output terminal 32 as differential signals with improved SVR characteristics. However, this differential signal input type filter circuit suffers from the drawback that its circuit is necessarily large, since it needs to contain two sets of n-order filter circuits.

Moreover, in the single-signal input type filter circuit illustrated in FIG. 2, if supply voltage Vcc includes superposed noise, reference voltage 110 delivered from the reference voltage generator circuit 34 also carries superposed noise, but is directly applied to the post-amplifier circuit 37 as its reference voltage. Meanwhile, the input signal from the input terminal 33 has its noise component reduced by the first-stage primary filter 35, and comes out as signal 111. As the signal passes through the corresponding (n-1)-order circuit 36, its noise component is filtered out further, and the signal is applied to the post-amplifier circuit 37 as signal 112 with improved SVR characteristics. Upon receiving the input of reference voltage 110 and signal 112 mentioned above, the post-amplifier circuit 37 differentially amplifies signal 112 with reference to reference voltage 110 which carries a different noise component, and outputs the signal through the differential output terminal 38. Since the post-amplifier circuit 37 performs differential amplification with two signal inputs carrying different noise components, the single-signal input type filter circuit in question suffers from degraded SVR characteristics, as compared to the differential input type filter circuit described above. Nevertheless, it does allow a smaller circuit to be configured.

Furthermore, as a usual solution adopted in common for the filter circuits, their power supply is often provided with a filter for the purpose of improving the SVR characteristics by reducing or removing noise in the supply voltage. In this case, external component parts are necessary for the filter circuits. Generally, in cases where SVR characteristics are especially important, and where removing noise superposed on the supply voltage is very necessary, it is customary to use the differential signal input type filter circuit described above, although it necessarily requires a larger circuit.

As described above, in a filter circuit configured as a conventional differential output filter, such as a differential input type filter circuit, two n-order filter circuits are provided to correspond with the differential input signals, and these n-order filters help improve the SVR characteristics. However, to obtain this advantage, it is necessary to deal with a large circuit.

On the other hand, a single-signal input type filter circuit consists of one n-order filter circuit for a single signal. Although this allows the circuit to be small, it also has the disadvantage of degraded SVR characteristics.

When applied to a single-signal input type differential output filter circuit, the invention works to implement a single-signal input/differential output type filter circuit that offers improved SVR characteristics within a specified frequency region. For this, an SVR correction circuit is provided for filtering out the noise superposed on the reference voltage delivered from a prescribed reference voltage generator circuit. And, by properly matching the frequency characteristics of the SVR correction circuit to the frequency characteristics of the n-order filter circuit corresponding to a prescribed input signal, any frequency region of improvement can be selected without changing the circuit scale.

SUMMARY OF THE INVENTION

It is an object of the present invention to provide a differential output type filter circuit of the single-signal input type capable of improving the SVR characteristics of conventional single-input type filter circuits, especially with the selectivity of frequencies, and which can, at the same time, allow a circuit that is nearly the same size as conventional differential type signal input type filter circuits.

The filter circuit of the invention is characterized by a configuration comprising at least an n-order filter circuit which reduces the noise superposed on an input signal that is provided to it a reference voltage generator circuit which receives a supply voltage and which generates and outputs a reference voltage, a supply voltage rejection and correction circuit which takes in the reference voltage and outputs this reference voltage after reducing or removing noise superposed on it, and a post-amplifier circuit which receives the output signal from the n-order filter circuit and the output signal from the supply voltage rejection and correction circuit and performs differential amplification on them.

Moreover, a primary filter circuit can be provided and set up in such a manner that the frequency characteristics of the supply voltage rejection and correction circuit corresponding to the noise will become nearly equal to the characteristics of the n-order filter circuit in the neighborhood of the specific arbitrarily selected frequency.

Furthermore, the n-order filter can be composed of a first-stage primary filter circuit that outputs the input signal after reducing the noise superposed on it, and an (n−1)-order filter circuit that delivers the output signal from the primary filter circuit after reducing the noise superposed on it.

DETAILED DESCRIPTION OF THE PREFERRED EMBODIMENTS

Figure 3:
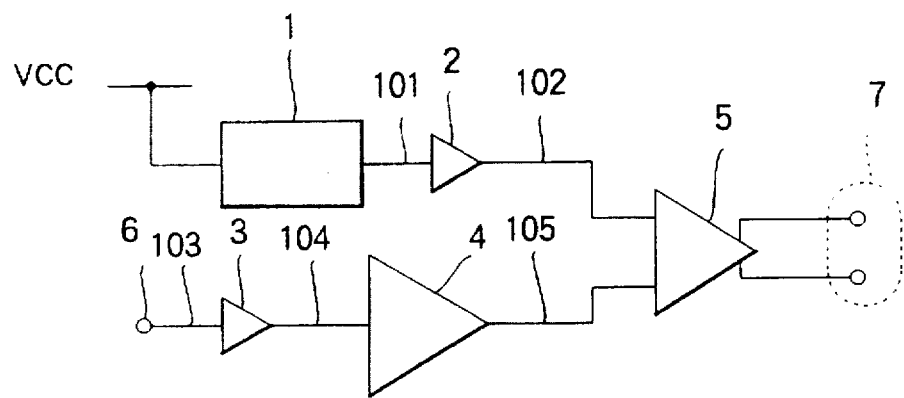
FIG. 3 is a block diagram showing a sample embodiment of the invention.

The preferred embodiments of the present invention will be explained below with reference to the attached drawings. FIG. 3 is a block diagram illustrating a filter circuit relating to one sample embodiment of the invention. As shown in FIG. 3, the filter circuit of the sample embodiment comprises a reference voltage generator circuit 1 which receives supply voltage Vcc and delivers reference voltage 101, an SVR correction circuit 2 which delivers reference voltage 102 after filtering out the noise component superposed on the reference voltage 101, an n-order filter circuit composed of a first-stage primary filter circuit 3 and an (n−1)-order filter circuit 4 that functions to filter out the noise of the input signal 103 and delivers signal 105, in correspondence with input signal 103 from the input terminal 6, and a post-amplifier circuit 5 which takes in reference voltage 102 delivered from the SVR correction circuit 2 and signal 105 delivered from the n-order filter circuit, and which applies differential amplification to the signal 105, between an input terminal 6 through which signal 103 is input and a differential output terminal 7 through which the differential signal from the filter circuit is delivered. This sample embodiment constitutes a single-signal input type filter circuit.

Figure 4:
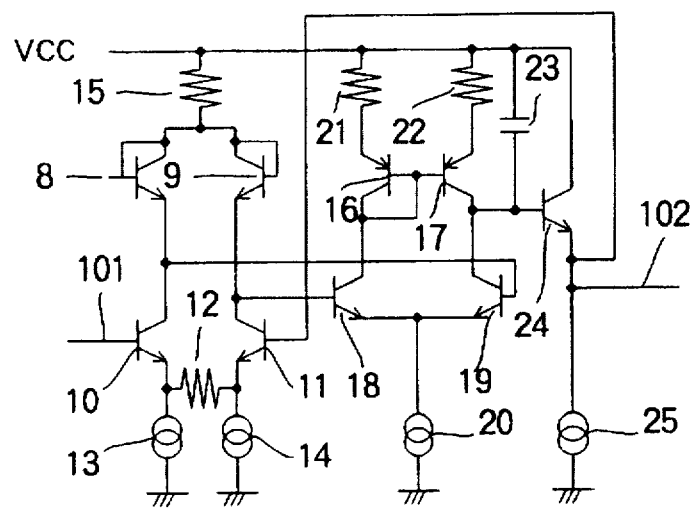
FIG. 4 is a circuit diagram showing the SVR correction circuit included in the sample embodiment.

Moreover, FIG. 4 is a circuit diagram illustrating the composition of one sample embodiment of the SVR correction circuit 2, which is configured as a filter circuit on nearly the same level as the first-stage primary filter circuit 3. The SVR correction circuit 2 comprises the NPN transistors 8 to 11, 18, 19 and 24, the resistances 12, 15, 21 and 22, the constant-current sources 13, 14, 20 and 25, the PNP transistors 16 and 17, and the capacitance 23, and consists of a two-stage differential amplifier circuit that includes a feedback circuit.

When the supply voltage Vcc that is fed to this filter circuit includes superposed noise, both reference voltage 101 (which is delivered from the reference voltage generator circuit 1) and signal 103 (which is delivered from the input terminal 6) also carry superposed noise. As reference voltage 101 is applied to the SVR correction circuit 2, it has its superposed noise filtered out, and then enters the post-amplifier circuit 5 as reference voltage 102 with a reduced noise level. This SVR correction circuit 2 is configured in the manner described above, and its two-stage differential amplification offsets the noise superposed on reference voltage 101, which is then applied to the post-amplifier 5. At the same time, the signal applied through the input terminal 6 has similar superposed noise. Signal 104, with reduced noise (which leaves the first-stage primary filter circuit 3), is output through the (n−1)-order filter circuit 4, and has its noise filtered out further by an n-order filter composed of the first-stage primary filter circuit 3 and the (n−1)-order filter circuit 4. The signal then appears as signal 105, with improved SVR characteristics, and enters the post-amplifier circuit 5. In this connection, the noise suppression characteristics of the SVR correction circuit 2 and those of the n-order filter circuit have previously been matched to each other so as to be nearly equal. This allows the residual noise superposed on reference voltage 102 (which is delivered from the SVR correction circuit 2) and the residual noise superposed on signal 105 (which is delivered from the (n−1)-order filter circuit 4) to be filtered out equally. Therefore, signal 105 is subjected to differential amplification in the post-amplifier circuit 5, using reference voltage 102 as the reference voltage input, and has its noise reduced further through the differentially amplifying action of the post-amplifier circuit 5, finally being output through the differential output terminal 7 as a differential signal with excellent SVR characteristics.

Figure 5:
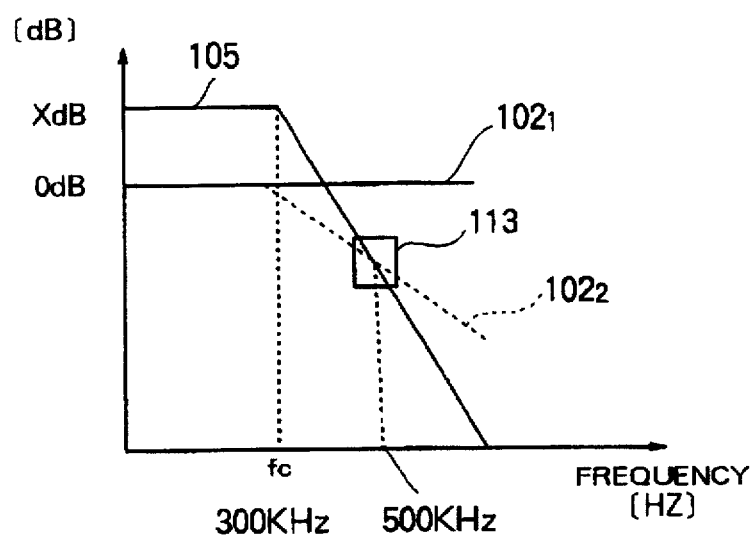
FIG. 5 is a diagram showing the output characteristics of the reference voltage generator circuit and the output characteristics of the SVR correction circuit in the sample embodiment.

Next, a concrete case of improvement of the SVR characteristics attained by matching the characteristics of the SVR correction circuit 2 to those of the n-order filter circuit will be explained below, with reference to FIG. 5. For example, in the case where the n-order filter circuit is a low-pass filter with a cutoff frequency of 300 kHz, and the goal is to improve the SVR characteristics in the proximities of 500 kHz, the frequency characteristics of the noise component 1022 superposed on output signal 102 from the SVR correction circuit 2 are matched to the frequency characteristics of output signal 105 of the n-order filter circuit in such a manner that they will cross each other in the proximity of 500 kHz. In this case, the frequency characteristics of noise component 1022 superposed on reference voltage 102 and the frequency characteristics of signal 105 will become as shown in FIG. 5, and the noise in neighborhood 113 of the point where both frequency characteristics cross each other in the proximity of 500 kHz will become almost the same in terms of frequency characteristics. This allows the superposed noise to be offset efficiently, leading to a substantial improvement of the SVR characteristics. In this way, it will be possible to improve the SVR characteristics of differential output signals at any frequency by properly selecting the cutoff frequency of the SVR correction circuit 2, according to the noise level superposed on the reference voltage.

Figure 6:
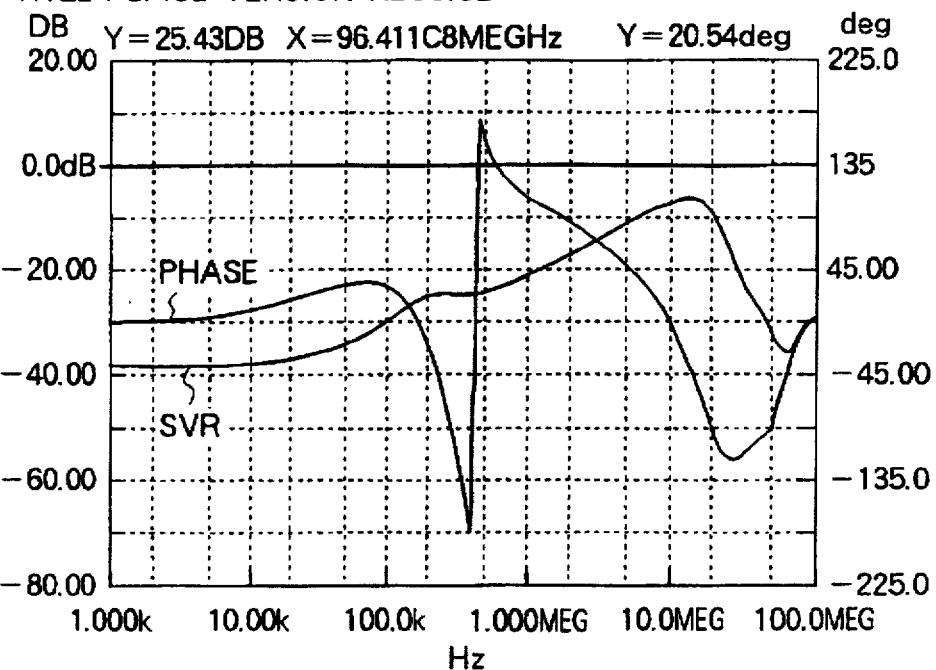
FIG. 6 is a diagram showing the SVR simulation characteristics of the sample embodiment.
Figure 7:
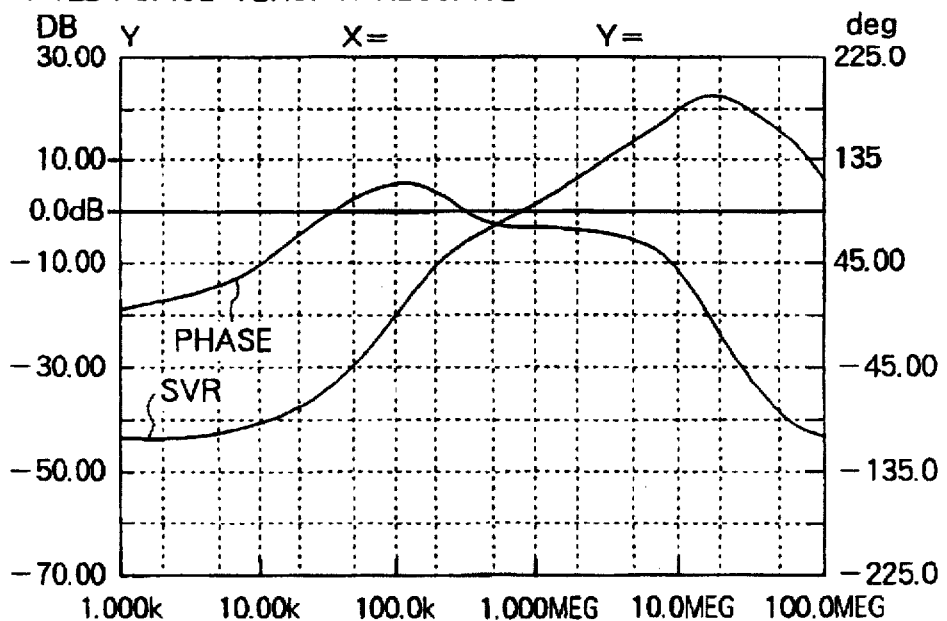
FIG. 7 is a diagram showing the SVR simulation characteristics of a conventional single-signal input type filter circuit.

Moreover, the results of a simulation performed on the SVR characteristics of a single-signal input type filter circuit employing a tertiary filter circuit relating to the invention are shown in FIG. 6, while the results of a simulation on the SVR characteristics of a conventional single-signal input type filter circuit are shown in FIG. 7. These simulations of SVR characteristics employed 5th-order band filter circuits and had an artificial noise (pulse) superposed on the power supply. Then the cutoff frequency of the SVR correction circuit 2 was matched in the proximity of 1 MHz. A comparison of the worst values of SVR characteristics from FIGS. 6 and 7 mentioned above indicates that the filter circuit of the invention improved the relevant worst value by approximately 30 dB, as compared to conventional single-signal input type filter circuits.

Figure 1:
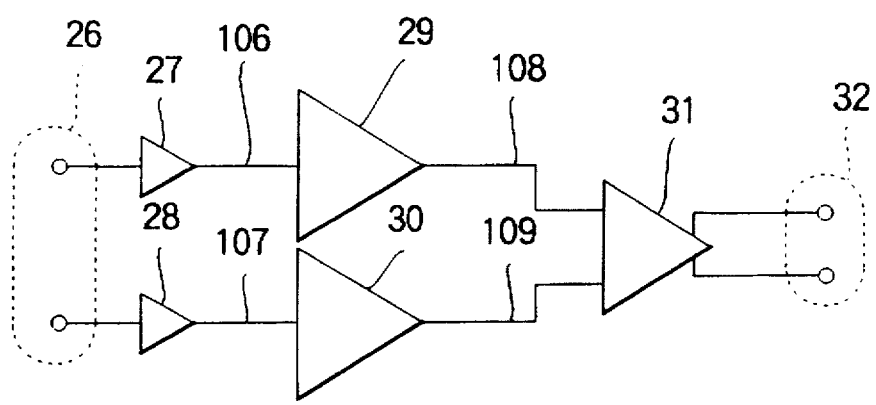
FIG. 1 is a block diagram showing a conventional differential signal input type filter circuit.
Figure 2:
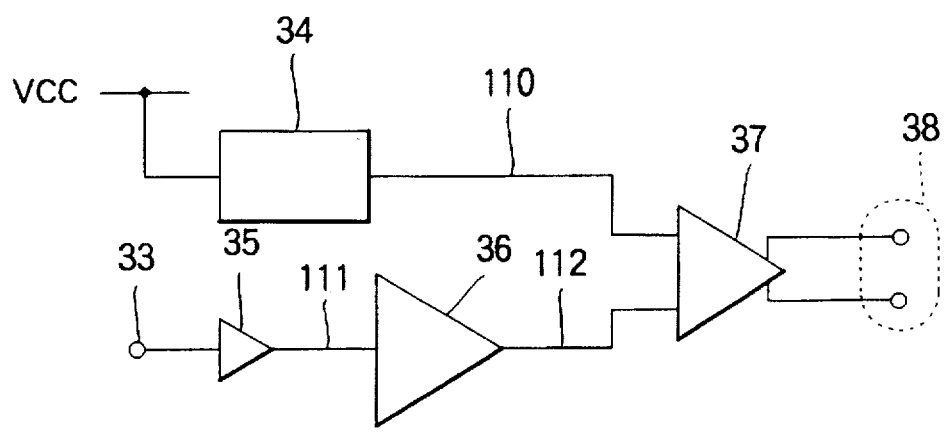
FIG. 2 is a block diagram showing a conventional single-signal input type filter circuit.

From the viewpoint of circuit scale, in the case where the n-order filter circuit is employed, the circuit scale ratio referred to that of the SVR correction circuit 2, which is defined as 1, provides the following results: (Sample embodiment of the invention shown in FIG. 3): (Conventional differential signal input type filter circuit shown in FIG. 1): (Conventional single-signal input type filter circuit shown in FIG. 2): (n+2): 2n:(n+1). As the value of the n-order of the n-order filter circuit increases, the sample embodiment of the invention more closely approximates the circuit scale of the conventional single-signal input type filter circuit. Namely, the invention provides an outstanding advantage in that SVR characteristics can be noticeably improved without increasing the size of the circuit and, furthermore, in that any frequency can be selected for improvement with respect to SVR characteristics.

What is claimed is:

1. A differential output type filter circuit comprising:

an n-order filter circuit which is provided with an input signal and which outputs the input signal after reducing superposed noise;

a reference voltage generator circuit which receives a supply voltage and which creates and outputs a reference voltage;

a supply voltage rejection and correction circuit which receives said reference voltage and which outputs the reference voltage after reducing or removing superposed noise; and a post-amplifier which applies differential amplification to the output signal from said n-order filter circuit relative to the reference voltage applied from said supply voltage rejection and correction circuit and which creates and outputs a differential signal.

2. The filter circuit according to claim 1, comprising:

a primary filter circuit which is set up in such a manner that the frequency characteristics of said supply voltage rejection and correction circuit that correspond to the noise will approximate those of said n-order filter circuit in the neighborhood of a specific arbitrarily selected frequency.

3. The filter circuit according to claim 1, wherein said n-order filter includes a first-stage primary filter which outputs said input signal after reducing superposed noise; and an (n−1) order filter circuit which delivers the output signal from said primary filter circuit after reducing superposed noise.

4. The filter circuit according to claim 2, wherein said n-order filter includes a first-stage primary filter which outputs said input signal after reducing superposed noise; and an (n−1) order filter circuit which delivers the output signal from said primary filter circuit after reducing superposed noise.

\* \* \* \* \*